United States Patent [19]
Hotta

[11] Patent Number: 5,402,387
[45] Date of Patent: Mar. 28, 1995

[54] SEMICONDUCTOR MEMORY

[75] Inventor: Yasuhiro Hotta, Nara, Japan

[73] Assignee: Sharp Kabushiki Kaisha, Osaka, Japan

[21] Appl. No.: 31,177

[22] Filed: Mar. 12, 1993

[30] Foreign Application Priority Data

Mar. 12, 1992 [JP] Japan ................................. 4-53159
Mar. 24, 1992 [JP] Japan ................................. 4-65736
Oct. 20, 1992 [JP] Japan ................................. 4-281998

[51] Int. Cl.$^6$ .............................................. G11C 7/00
[52] U.S. Cl. ............................. 365/230.08; 365/189.05
[58] Field of Search ....................... 365/230.08, 189.05, 365/206

[56] References Cited

U.S. PATENT DOCUMENTS 4,337,525  6/1982  Akatsuka ............................ 365/233
4,458,337  7/1984  Takomae et al. ........... 365/230.08 X
4,879,681 11/1989  Miwa et al. ..................... 365/189.01

FOREIGN PATENT DOCUMENTS 0064569 11/1982  European Pat. Off. .
0499264 10/1991  European Pat. Off. .
0473127  3/1992  European Pat. Off. .
57-94986  6/1982  Japan .

*Primary Examiner*—Do Hyun Yoo
*Attorney, Agent, or Firm*—Morrison & Foerster

[57] ABSTRACT

A semiconductor memory including a memory cell array having a plurality of memory cells; an input buffer circuit for receiving an address signal having an amplitude at an interface level and generating at least one output signal having an amplitude at an internal logic level in accordance with said address signal, the input buffer circuit further receiving a first signal and changing the response characteristics thereof in response to the first signal; a detecting circuit for receiving the output signal and generating a detecting signal indicating whether the level of the output signal varies; and a control signal generating circuit for receiving the detecting signal and generating the first signal based on the detecting signal.

7 Claims, 14 Drawing Sheets

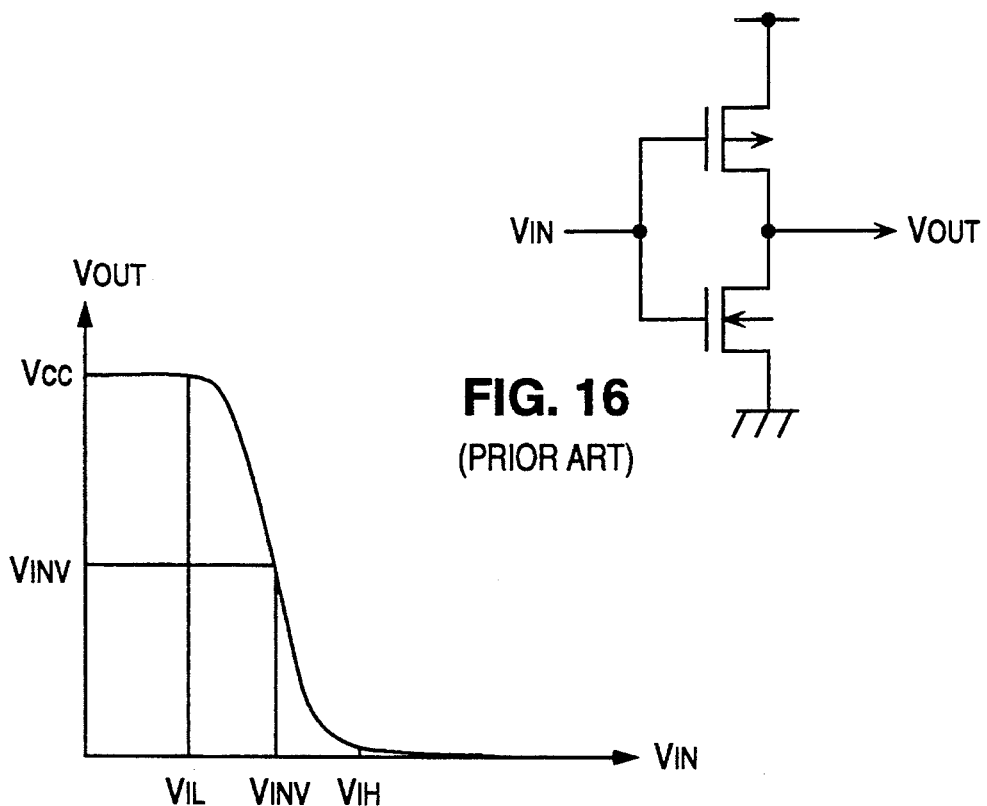
FIG. 16
(PRIOR ART)
FIG. 17
(PRIOR ART)
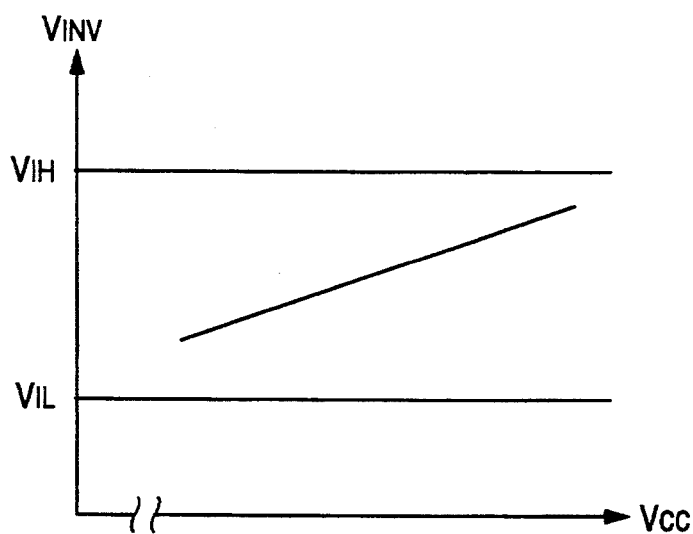
FIG. 18
(PRIOR ART)

SEMICONDUCTOR MEMORY

BACKGROUND OF THE INVENTION

1. Field of the Invention

The present invention relates to a semiconductor memory which Can attain a fast and stable data reading operation.

2. Description of the Related Art

As the semiconductor production techniques have been greatly improved recently, semiconductor memories have become more densely integrated and contain a larger memory capacitance. However, a semiconductor memory with a larger memory capacitance requires a longer time to read information stored therein. It is necessary to shorten the delay time of the input/output portion in the semiconductor memory to realize a high speed operation.

FIG. 13 shows a typical circuit structure of a conventional semiconductor memory 1300.

An address signal input via a bus or the like is fed to an X decoder 1302 and a Y decoder 1303 via an address input buffer circuit 1301 to indicate a particular piece of data on a memory cell array 1304. The data on the memory Cell array 1304 indicated by the address signal is read by a sense amplifier 1305 and output to the outside via an output buffer circuit 1306.

The address signal input by the address input buffer circuit 1301 is also fed to an address input detecting circuit 1307. Upon detecting a change of the input address signal, the address input detecting circuit 1307 puts a timing signal generating circuit 1308 into operation on the basis of the timing for detecting the change. The timing signal generating circuit 1308 generates control signals such as a precharge signal $\phi_1$ and an output buffer stopping signal $\phi_2$. The precharge signal $\phi_1$ precharges bit lines (not shown) of the memory cell array 1304 before reading data. The output buffer stopping signal $\phi_2$ stops the operation of the output buffer circuit 1306 during a predetermined period of time during which the sense amplifier 1305 reads a piece of data in the memory cell array 1304.

An output enable signal is input to an output buffer control circuit 1310 via an output enable input buffer circuit 1309. The output enable signal controls the output buffer circuit 1306 from the outside. The output buffer control circuit 1310 outputs an output buffer operating signal $\overline{OE}$ that becomes non-active when the output enable signal becomes non-active or when the output buffer stopping signal $\phi_2$ becomes active. When the output buffer operating signal $\overline{OE}$ is active, the output buffer circuit 1306 outputs the data read by the sense amplifier 1305 to the outside. When the output buffer operating signal $\overline{OE}$ is non-active, the output buffer circuit 1306 stops outputting the data.

FIGS. 14 and 15 show waveforms of each signal used in the semiconductor memory 1300. The operation of the semiconductor memory 1300 will now be described referring to FIGS. 14 and 15.

A change of the address signal causes changes of output signals $A_i$ and $A_j$ output by the address input buffer circuit 1301. In response to the changes of the output signals $A_i$ and $A_j$, the X decoder 1302 and the Y decoder 1303 start operating and the address input detecting circuit 1307 puts the timing signal generating circuit 1308 into operation. A low to high transition (a transition to be active) of the precharge signal $\phi_1$ results in precharging the bit lines (not shown) of the memory cell array 1304. Then, the sense amplifier 1305 reads data from the memory cell array 1304. The output buffer stopping signal $\phi_2$ is at a high level (active) during a predetermined period of time, resulting in keeping the output buffer operating signal $\overline{OE}$ at a high level (non-active) during the predetermined period. Then, when the output buffer stopping signal $\phi_2$ undergoes a high to low transition (becomes non-active), the output buffer operating signal $\overline{OE}$ undergoes a high to low transition becomes active). As a result, the output buffer circuit 1306 starts outputting the data read by the sense amplifier 1305.

A high to low transition of the output enable signal (a transition to be active) causes a high to low transition (a transition to be active ) of the output buffer operating signal $\overline{OE}$ as is shown in FIG. 15. As a result, the output buffer circuit 1306 starts outputting the data read by the sense amplifier 1305.

Each of the address input buffer circuit 1301 and the output enable input buffer circuit 1309 is constituted by a CMOS inverter circuit as shown in FIG. 16. An inverted voltage $V_{INV}$ (FIG. 17) of the CMOS inverter circuit can be set by selecting respective circuit parameters of a PMOS transistor and an NMOS transistor included in the CMOS inverter circuit. For example, when the CMOS inverter circuit receives an output level from a TTL, the inverted voltage $V_{INV}$ is set so that an output signal $V_{OUT}$ undergoes a low to high transition whenan input signal $V_{IN}$ is less than 0.8 V ($V_{IL}$), and that the output signal $V_{OUT}$ undergoes a high to low transition when the input signal $V_{IN}$ is more than 2.2 V ($V_{IH}$) as is shown in FIG. 17.

FIG. 18 shows the dependency of the inverted voltage $V_{INV}$ on a supply voltage $V_{CC}$. As is shown in FIG. 18, the inverted voltage $V_{INV}$ rises as the supply voltage $V_{CC}$ rises. As a result, the higher the supply voltage $V_{CC}$ becomes, the smaller the difference between the voltage $V_{IH}$ and the inverted voltage $V_{INV}$ ($V_{IH}$-$V_{INV}$) becomes. Thus, it is difficult to secure a noise margin of a sufficient size. When the noise margin has such a small size and an internal ground potential GND becomes unstable, levels of input signals can be misjudged.

For example, when the output buffer circuit 1306 starts operating, a large current transitionally occurs, which makes the internal ground potential GND temporarily unstable. Such transient of the internal ground potential GND can cause changes of the levels of the output signals $A_i$ and $A_j$ output by the address input buffer circuit 1301. In such a case, the address input detecting circuit 1307 misjudges this change to be a change in the address signal. As a result, the data reading operation is performed in error as is shown in FIGS. 14 and 15 by dashed lines.

In order to avoid the above-mentioned malfunction, in a conventional semiconductor memory, the driving ability of the output buffer circuit 1306 is limited to minimize the instantaneous current and the response property of the address input buffer circuit 1301 is degraded. Thus, the change of the address signal is not detected in error even when the internal ground potential GND becomes rather unstable. Accordingly, the conventional semiconductor memory has a problem that a high speed operation must be sacrificed to attain a stable operation.

SUMMARY OF THE INVENTION

The semiconductor memory of this invention has a memory cell array including a plurality of memory cells; an input buffer circuit for receiving an address signal having an amplitude at an interface level and generating at least one output signal having an amplitude at an internal logic level in accordance with the address signal, the input buffer circuit further receiving a first signal and changing the response characteristics thereof in response to the first signal; a detecting circuit for receiving the output signal and generating a detecting signal indicating whether the level of the output signal varies; and a control signal generating circuit for receiving the detecting signal and generating the first signal based on the detecting signal.

In one embodiment, the semiconductor memory further has a sense amplifier for reading out data from at least one memory cell among the plurality of memory cells; and an output buffer circuit for outputting the read out data. The control signal generating circuit further generates a control signal for deactivating the output buffer circuit during a predetermined period of time which is required to fix the read out data, and the level of the first signal varies depending upon the predetermined period of time.

In another aspect of the present invention, the semiconductor memory has a memory cell array including a plurality of memory cells; an input buffer circuit for receiving an address signal having an amplitude at an interface level and generating at least one output signal having an amplitude at an internal logic level in accordance with the address signal, the input buffer circuit further receiving a first signal and changing the response characteristics thereof in response to the first signal; and a supply voltage detecting circuit for generating a detecting signal indicating whether a supply voltage is higher than a predetermined voltage, the detection signal being supplied to the input buffer circuit as the first signal.

In still another aspect of the present invention, the semiconductor memory has a memory cell array including a plurality of memory cells; an input buffer circuit for receiving a first signal having an amplitude at an interface level and generating at least one second signal having an amplitude at an internal logic level in accordance with the first signal, the input buffer circuit further receiving a third signal and changing the response characteristics thereof in response to the third signal; a sense amplifier for reading out data from at least one memory cell among the plurality of memory cells; an output buffer circuit for outputting the read out data; an output buffer control circuit for receiving the second signal and a fourth signal for deactivating the output buffer circuit during a predetermined period which is required to fix the read out data and generating a fifth signal for determining the timing for starting an operation of the output buffer circuit based on the second and the fourth signals; a detecting circuit for receiving the fifth signal and generating a sixth signal indicating whether the level of the fifth signal varies; and a control signal generating circuit for receiving the sixth signal and generating the third signal based on the sixth signal.

In one embodiment, the semiconductor memory further has an input buffer circuit for receiving an address signal having an amplitude at an interface level and generating at least one seventh signal having amplitude at an internal logic level in accordance with the address signal, and the input buffer circuit further receives the third signal and changes the response characteristics thereof in response to the third signal.

In one embodiment, the semiconductor memory further has a supply voltage detecting circuit for generating an eighth signal indicating whether a supply voltage is higher than a predetermined voltage. The control signal generating circuit further receives the eighth signal and generates the third signal based on the sixth and the eighth signals.

In one embodiment, the level of the third signal varies depending upon the predetermined period with respect to the fourth signal.

Thus, the invention described herein makes possible the advantage of providing a semiconductor memory with a fast and stable operation by changing response characteristics of an input buffer circuit at the beginning of the operation thereof.

This and other advantages of the present invention will become apparent to those skilled in the art upon reading and understanding the following detailed description with reference to the accompanying figures.

BRIEF DESCRIPTION OF THE DRAWINGS

FIG. 16 shows a CMOS inverter circuit used in an address input buffer circuit and an output enable input buffer circuit for the conventional semiconductor memory of FIG. 13.

FIG. 17 shows the relationship between an input signal and an output signal in the CMOS inverter of FIG. 16.

FIG. 18 shows the dependency of an inverted voltage on a supply voltage in the CMOS inverter of FIG. 16.

DESCRIPTION OF THE PREFERRED EMBODIMENTS

The present invention will now be described by way of examples.

Example 1

Figure 1:
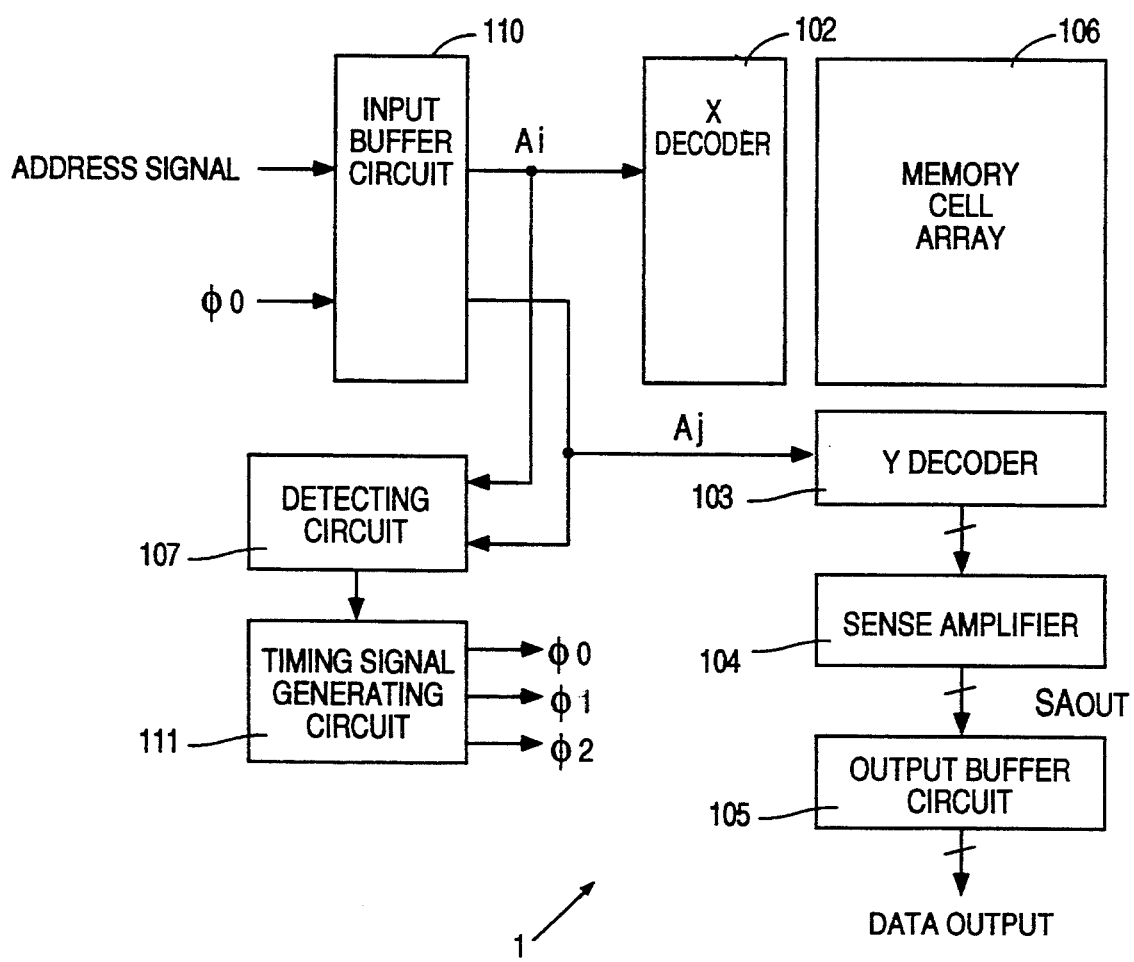
FIG. 1 shows a structure for a semiconductor memory as a first example according to the present invention.

FIG. 1 shows a structure for a semiconductor memory 1 as an example of the present invention. An input buffer circuit 110 receives an address signal having an amplitude at an interface level and outputs output signals $A_i$ and $A_j$ each having an amplitude at an internal logic level in accordance with the address signal. The input buffer circuit 110 also receives a signal $\phi_0$ described below and changes its own response characteristics in response to the signal $\phi_0$. The output signal $A_i$ is fed to an X decoder 102 and a detecting circuit 107, and the output signal $A_j$ is fed to a Y decoder 103 and the detecting circuit 107. The X decoder 102 and the Y decoder 103 are operated in response to changes of the output signals $A_i$ and $A_j$. The detecting circuit 107 generates a detection signal in detecting a change in the output signals $A_i$ and $A_j$. A timing signal generating circuit 111 controls a fast reading operation or a stable operation of memory cells. The timing signal generating circuit 111 generates pulse signals which are required for reading out data from a memory cell array 106 in accordance with the detection signal generated by the detecting circuit 107. For example, the timing signal generating circuit 111 generates a precharge signal $\phi_1$ for precharging bit lines (not shown) and a signal $\phi_2$ for deactivating an output buffer circuit 105 during an internal reading operation. The timing signal generating circuit 111 further generates the signal $\phi_0$ for changing the response characteristics of the input buffer circuit 110 apart from the signals $\phi_1$ and $\phi_2$.

Figure 2:
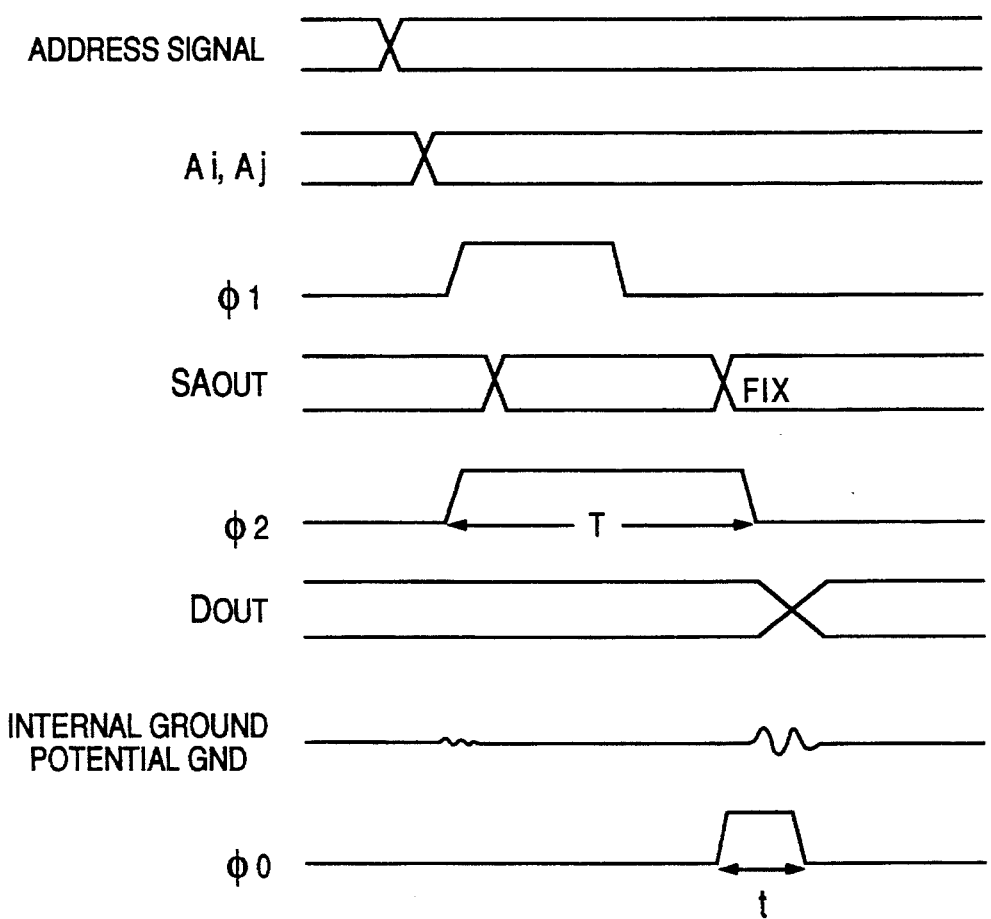
FIG. 2 shows a waveform for each signal used in the semiconductor memory of FIG. 1.

FIG. 2 shows a waveform for each signal used in the semiconductor memory 1. The operation of the semiconductor memory 1 will now be described referring to FIG. 2.

The X decoder 102 and the Y decoder 103 start operating in response to transitions of the address signals $A_i$ and $A_j$ output by the input buffer circuit 110. The X decoder 102 and the Y decoder 103 select at least one memory cell among a plurality of memory cells contained in the memory cell array 106 in accordance with the address signals $A_i$ and $A_j$. The timing signal generating circuit 111 outputs the signals $\phi_0$, $\phi_1$ and $\phi_2$ in accordance with the output of the detecting circuit 107.

The signal $\phi_2$ is supplied to the output buffer circuit 105. S When the signal $\phi_2$ is at a high level, the output buffer circuit 105 is kept in a deactivated state, and when the signal $\phi_2$ is at a low level, the output buffer circuit 105 is kept in an activated state. The signal $\phi_2$ is kept at a high level only during a predetermined period T which is required to fix data read out from the memory cells after the transition of the address signals $A_i$ and $A_j$. As a result, the output buffer circuit 105 is kept deactivated during the period T. The signal $\phi_2$ undergoes a high to low transition after the predetermined period T has passed, resulting in activating the output buffer circuit 105 and feeding out the data read out from the memory cells via the output buffer circuit 105.

The signal $\phi_0$ is supplied to the input buffer circuit 110 as a signal for changing the response characteristics of the input buffer circuit 110. The signal $\phi_0$ undergoes a low to high transition just before the predetermined period T of the signal $\phi_2$ finishes, and then is kept at a high level during a predetermined period t. The length of the period t is determined so that the amplitude of transient noise from the internal ground potential GND is reduced to be sufficiently small within the period t. The timing of the low to high transition of the signal $\phi_0$ is determined depending on various conditions such as the characteristics of other internal circuits. For example, under a particular condition, the length of the period t may be set to 15 to 20 ns, and the timing of the low to high transition of the signal $\phi_0$ may be earlier than the timing of the high to low transition of the signal $\phi_2$ by 0 to 5 ns.

Figure 3:
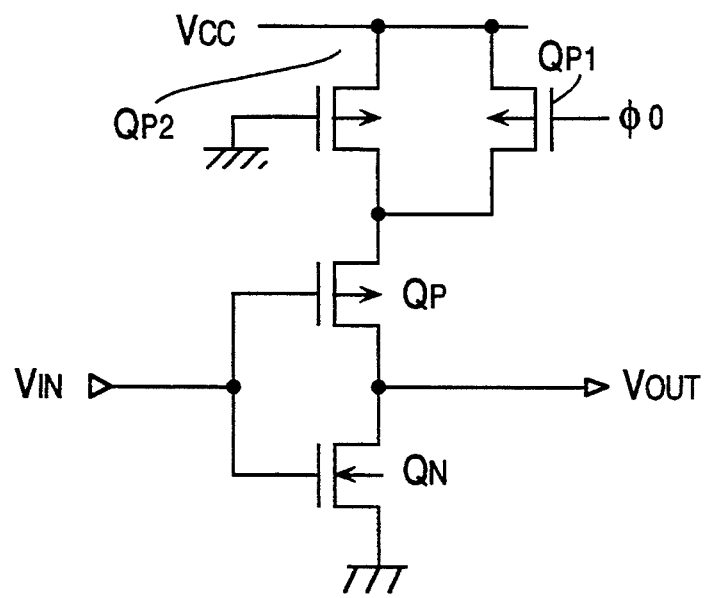
FIG. 3 shows a circuit structure for an input buffer circuit used in the semiconductor memory of FIG. 1.

FIG. 3 shows a circuit structure for the input buffer circuit 110. The input buffer circuit 110 has PMOS transistors $Q_{P1}$ and $Q_{P2}$ in addition to the circuit components of the conventional CMOS inverter circuit shown in FIG. 16. The PMOS transistors $Q_{P1}$ and $Q_{P2}$ are connected to a power voltage source $V_{CC}$ with their sources and are connected to a source of the PMOS transistor $Q_p$ with their drains, respectively. The signal $\phi_0$ is supplied to a gate of the PMOS transistor $Q_{P1}$. The gate of the PMOS transistor $Q_{P2}$ is grounded.

A low to high transition of the signal $\phi_0$ turns the PMOS transistor $Q_{P1}$ off. As a result, a voltage dropped by the PMOS transistor $Q_{P2}$ is supplied to the PMOS transistor $Q_p$ as a supply voltage. Thus, while the signal $\phi_0$ is at a high level, an inverted voltage $V_{INV}$ of the input buffer circuit 110 can be temporarily lowered, thereby extending the noise margin. As a result, as is shown in FIG. 2, the signals $A_i$ and $A_j$ output by the input buffer circuit 110 are not inverted in error even when an internal ground potential GND is made unstable by the operation of the output buffer circuit 105. Thus, it is possible to keep the input buffer circuit 110 stable against transient noise from the internal ground potential GND by temporarily lowering the response property of the input buffer circuit 110 in response to the signal $\phi_0$.

Figure 4:
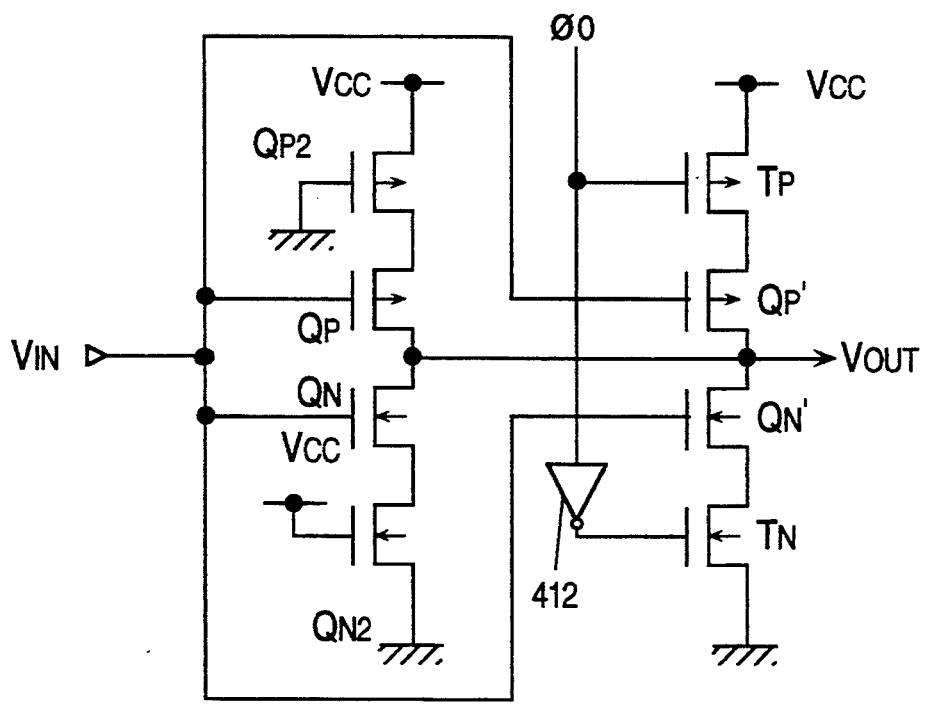
FIG. 4 shows another circuit structure for the input buffer circuit used in the semiconductor memory of FIG. 1.

FIG. 4 shows another circuit structure for the input buffer circuit 110. The input buffer circuit 110 has a PMOS transistor $Q_p$ and an NMOS transistor $Q_N$ constituting a first CMOS structure, a PMOS transistor $Q_{P2}$ connected to a supply voltage $V_{CC}$ and a source of the PMOS transistor $Q_p$, an NMOS transistor $Q_{N2}$ connected to a source of the NMOS transistor $Q_N$ and grounded, a PMOS transistor $Q_{p'}$ and an NMOS transistor $Q_{N'}$ connected in parallel to the first CMOS structure and constituting a second CMOS structure, a PMOS transistor $T_P$ connected to a supply voltage $V_{CC}$ and a source of the PMOS transistor $Q_{p'}$, and an NMOS transistor $T_N$ connected to a source of the NMOS transistor $Q_{N'}$ and grounded. A gate of the PMOS transistor $Q_{P2}$ is grounded. A gate of the NMOS transistor $Q_{N2}$ is connected to a supply voltage $V_{CC}$. The signal $\phi_0$ is supplied to a gate of the PMOS transistor $T_P$. A signal obtained by inverting the signal $\phi_0$ by an inverter 412 is supplied to a gate of the NMOS transistor $T_N$.

The signal $\phi_0$ is applied to the input buffer circuit 110 at a timing as is shown in FIG. 2. As a result, also in the circuit structure as is shown in FIG. 4, the response speed of the input buffer circuit 110 can be temporarily lowered while the signal $\phi_0$ is at a high level. Thus, it is possible to keep the input buffer circuit 110 stable against the transient noise of the internal ground potential GND.

As is described above, according to this example, the noise margin of an input buffer circuit can be extended by changing the response characteristics of the input buffer circuit by using a timing signal. Thus, a semiconductor memory of the invention can attain a fast and stable operation even if the memory has a large capacitance.

Example 2

Figure 5A:
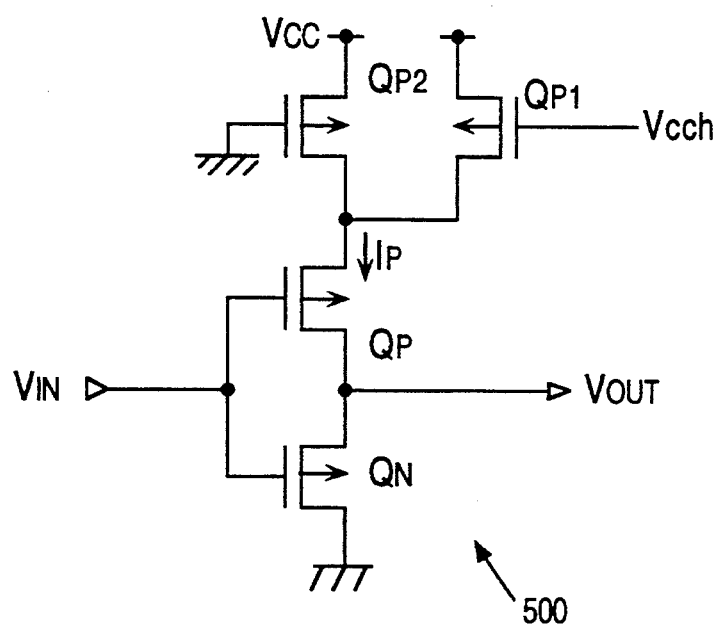
FIG. 5A shows still another circuit structure for the input buffer circuit used in the semiconductor memory of FIG. 1.

FIG. 5A shows another circuit structure for the input buffer circuit 110 of FIG. 3. The input buffer circuit 500 of FIG. 5A is different from the input buffer circuit 110 of FIG. 3 in that a supply voltage detection signal $V_{CCh}$ output by a supply voltage detecting circuit is supplied to the gate of the PMOS transistor $Q_{P1}$ shown in FIG. 5A while the timing signal $\phi_0$ is supplied to the gate of the PMOS transistor $Q_{P1}$ shown in FIG. 3. The other components in the input buffer circuit 500 of FIG. 5A are identical to those in the input buffer circuit 110 of FIG. 3.

The semiconductor memory of this example further has a supply voltage detecting circuit 510 in addition to the circuit components of the semiconductor memory 1 shown in FIG. 1.

Figure 5B:
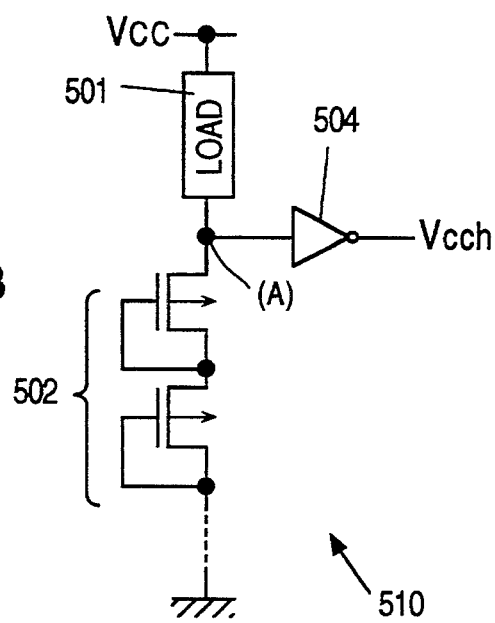
FIG. 5B shows a circuit structure for a supply voltage detecting circuit used in a semiconductor memory as a second example of the present invention.

FIG. 5B shows an example of the circuit structure of the supply voltage detecting circuit 510. The supply voltage detecting circuit 510 has a load 501 connected to a supply voltage $V_{CC}$, a plurality of MOS transistors 502 connected to the load 501 via a junction A and an inverter 504 connected to the junction A. The plurality of MOS transistors 502 are connected to each other with a diode. Specifically, each gate of the plurality of the MOS transistors 502 is connected to its own drain and to the source of the adjacent MOS transistor. One MOS transistor at one end of the plurality of MOS transistors 502 is connected to the junction A, and another MOS transistor at the other end is grounded. According to the circuit mentioned above, the supply voltage detection signal $V_{CCh}$ is generated as an output of the inverter 504.

The supply voltage detection signal $V_{CCh}$ is at a low level when the supply voltage $V_{CC}$ is lower than a predetermined voltage $V_a$, and is at a high level when the supply voltage $V_{CC}$ is higher than the predetermined voltage $V_a$. The voltage $V_a$ is set so that the inverted voltage $V_{INV}$ is approximately at a medium between a high level input $V_{ih}$ and a low level input $V_{il}$. Such a voltage $V_a$ can be obtained by appropriately designing a split voltage of the supply voltage detecting circuit 510.

Next, the operations of the input buffer circuit 500 of FIG. 5A and the supply voltage detecting circuit 510 of FIG. 5B will be described.

When the supply voltage $V_{CC}$ is lower than the voltage $V_a$, all the MOS transistors 502 shown in FIG. 5B are off, resulting in raising the potential at the junction A. Since this potential is inverted by the inverter 504, the supply voltage detection signal $V_{CCh}$ output by, the supply voltage detecting circuit 510 is at a low level. As a result, the supply voltage detection signal $V_{CCh}$ supplied to the gate of a PMOS transistor $Q_{P1}$ is at a low level to put the PMOS transistor $Q_{P1}$ in an ON state. Thus, a current $I_p$ flowing through this PMOS transistor $Q_{P1}$ is supplied to the PMOS transistor $Q_p$. The inverted voltage $V_{INV}$ of the input buffer circuit 500 is determined by the NMOS transistor $Q_N$ and the PMOS transistors $Q_P$, $Q_{P1}$ and $Q_{P2}$.

When the supply voltage $V_{CC}$ rises higher than the voltage $V_a$, all the MOS transistors 502 shown in FIG. 5B are turned on. As a result, the supply voltage detection signal $V_{CCh}$ output by the supply voltage detecting circuit 510 undergoes a low to high transition. Thus, since the supply voltage detection signal $V_{CCh}$ supplied to the gate of the PMOS transistor $Q_{P1}$ shown in FIG. 5A undergoes a low to high transition, the PMOS transistor $Q_{P1}$ is put in an OFF state, and the current $I_p$ flowing to the PMOS transistor $Q_p$ is lowered as compared with the case where the supply voltage detection signal $V_{CCh}$ is at a low level. The inverted voltage $V_{INV}$ of the input buffer circuit 500 is determined by the NMOS transistor $Q_N$ and the PMOS transistors $Q_P$ and $Q_{P2}$.

Figure 6:
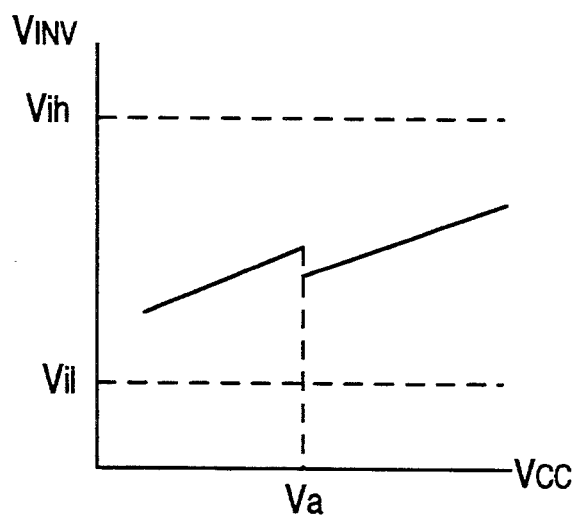
FIG. 6 shows the improved dependency of an inverted voltage of an input buffer circuit used in the second example of the present invention on a supply voltage.

FIG. 6 shows the improved dependency of the inverted voltage $V_{INV}$ of the input buffer circuit 500 on the supply voltage $V_{CC}$. As is shown in FIG. 6, the inverted voltage $V_{INV}$ of the input buffer circuit 500 is shifted downward when the supply voltage $V_{CC}$ is higher than the voltage $V_a$. Therefore, when the supply voltage $V_{CC}$ is higher than the voltage $V_a$, the inverted voltage $V_{INV}$ of the input buffer circuit 500 is lower than that of the conventional input buffer circuit. This also results in suppressing power loss.

According to the semiconductor memory of this example, the inverted voltage $V_{INV}$ of the input buffer circuit can be lower than that of the conventional input buffer circuit when the supply voltage $V_{CC}$ is higher than a predetermined voltage. Therefore, the margin of the input voltage to the supply voltage and the noise margin can be extended. As a result, the design of an integrated circuit as well as a connection to peripheral circuits is less restricted, thereby making the design of an electronic appliance easier. Moreover, any current loss in an input buffer circuit can be suppressed.

Example 3

Figure 7:
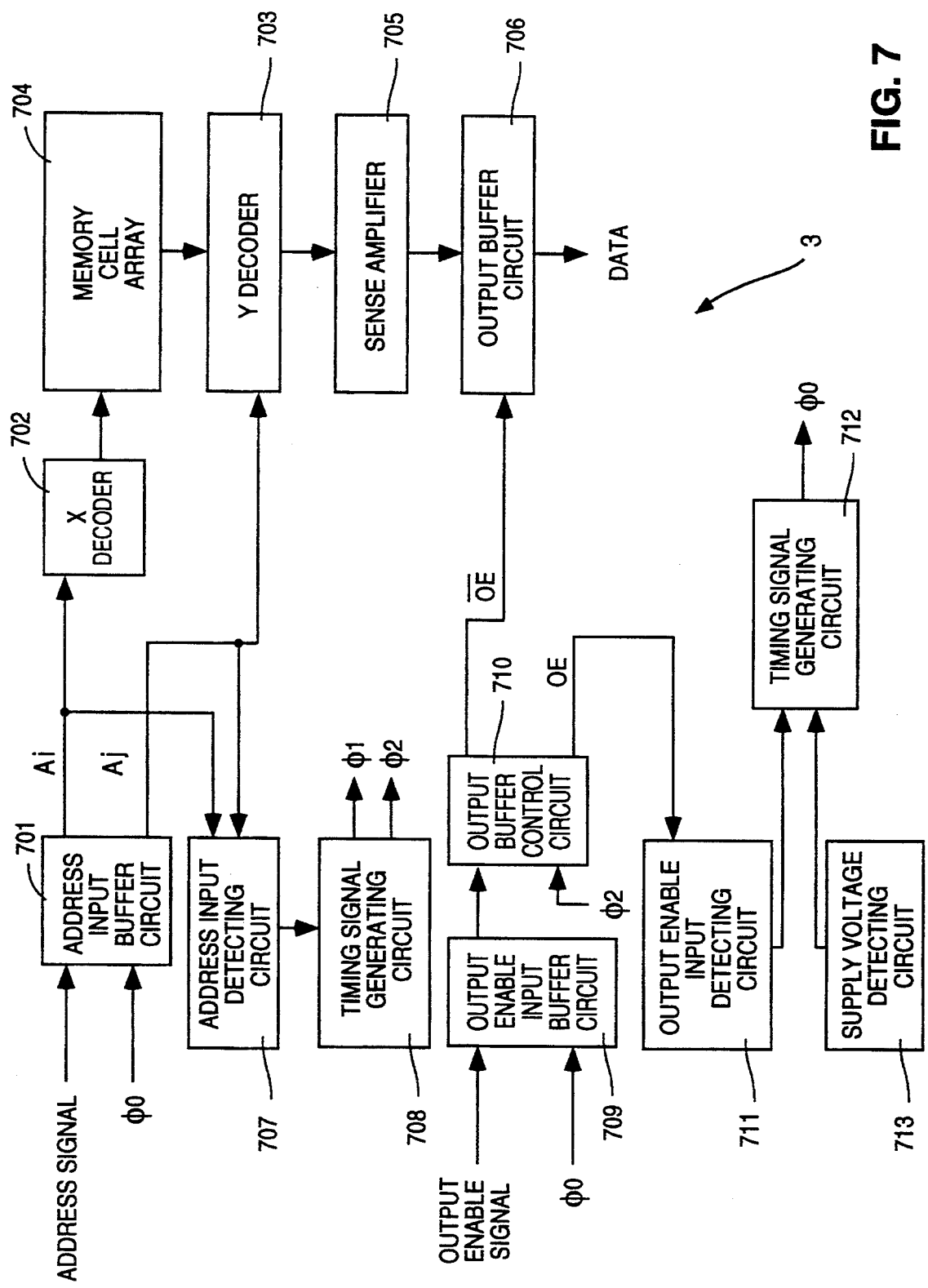
FIG. 7 shows a structure for a semiconductor memory as a third example of the present invention.

FIG. 7 shows a structure for a semiconductor memory 3 as another example of the present invention.

An address input buffer circuit 701 receives an address signal having an amplitude at an interface level and amplifies it into signals $A_i$ and $A_j$ each having an amplitude at an internal logic level. The address input buffer circuit 701 also receives a signal $\phi_0$ described below and changes its own response characteristics in response to the signal $\phi_0$. The response characteristics can include, for example, a response property and a response speed. The signals $A_i$ and $A_j$ output by the, address input buffer circuit 701 are fed to an X decoder 702 and a Y decoder 703, respectively, and are used to indicate a particular piece of data in a memory cell array 704. The data in the memory cell array 704 indicated by the signals $A_i$ and $A_j$ is read by a sense amplifier 705 and output to the outside via an output buffer circuit 706.

The signals $A_i$ and $A_j$ are also fed to an address input detecting circuit 707. The address input detecting circuit 707 having detected level transition of the signals $A_i$ and $A_j$ generates a detection signal based on a timing of the transition. A timing signal generating circuit 708 starts operating in response to the detection signal and then generates signals such as a precharge signal $\phi_1$ and an output buffer stopping signal $\phi_2$.

An output enable input buffer circuit 709 receives an output enable signal having an amplitude at an interface level land amplifies it into an output enable signal having an amplitude at an internal logic level. The output enable signal is input to an output buffer control circuit 710 via an output enable input buffer circuit 709. The output enable signal controls the output buffer circuit 706 from the outside. The output enable input buffer circuit 709 also receives the signal $\phi_0$ described below and changes its own response characteristics in response to the signal $\phi_0$. The output buffer control circuit 710 is a logic circuit for receiving the output enable signal and the signal $\phi_2$ and for outputting output buffer operating signals OE and $\overline{OE}$. When the output enable signal is non-active or when the output buffer stopping signal $\phi_2$ is active, the output buffer operating signal $\overline{OE}$ is non-active, but otherwise is active. The output buffer circuit 706 receives the output buffer operating signal $\overline{OE}$. When the output buffer operating signal $\overline{OE}$ is active, the output buffer circuit 706 outputs data read by the sense amplifier 705 to the outside. When the output buffer operating signal $\overline{OE}$ is non-active, the output buffer circuit 706 stops outputting the data.

The output buffer operating signal OE output by the output buffer control circuit 710 is fed to an output enable input detecting circuit 711. The output enable input detecting circuit 711 detects a transition of the output buffer operating signal OE to be active and then generates a detection signal on the bases of the timing of the transition. A timing signal generating circuit 712 starts operating in response to the detection signal and then generates the signal $\phi_0$. The signal $\phi_0$ remains active during a predetermined period of time when the output buffer operating signal OE becomes active.

The timing signal generating circuit 712 may further receive a signal from a supply voltage detecting circuit 713. The supply voltage detecting circuit 713 monitors whether or not a supply voltage is lower than a predetermined voltage, and when it detects the supply power lower than the predetermined voltage, it generates a detection signal. When the timing signal generating circuit 712 receives the detection signal from the supply voltage detecting circuit 713, the timing signal generating circuit 712 does not make the signal $\phi_0$ active even when the output buffer operating signal OE becomes active.

The signal $\phi_0$ is supplied to the address input buffer circuit 701 and the output enable input buffer circuit 709 as a signal for changing the response characteristics thereof.

Figure 8:
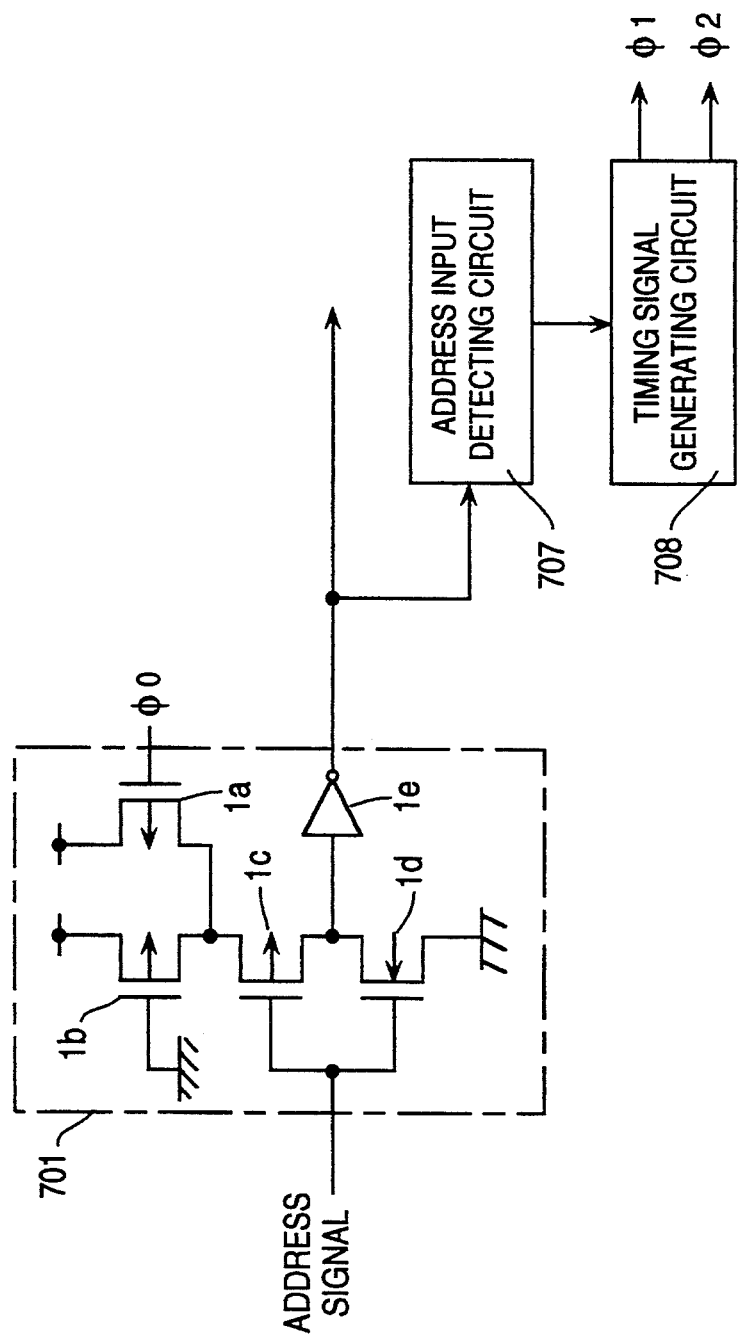
FIG. 8 shows an example for a circuit structure of an address buffer circuit used in the semiconductor memory of FIG. 7.
Figure 9:
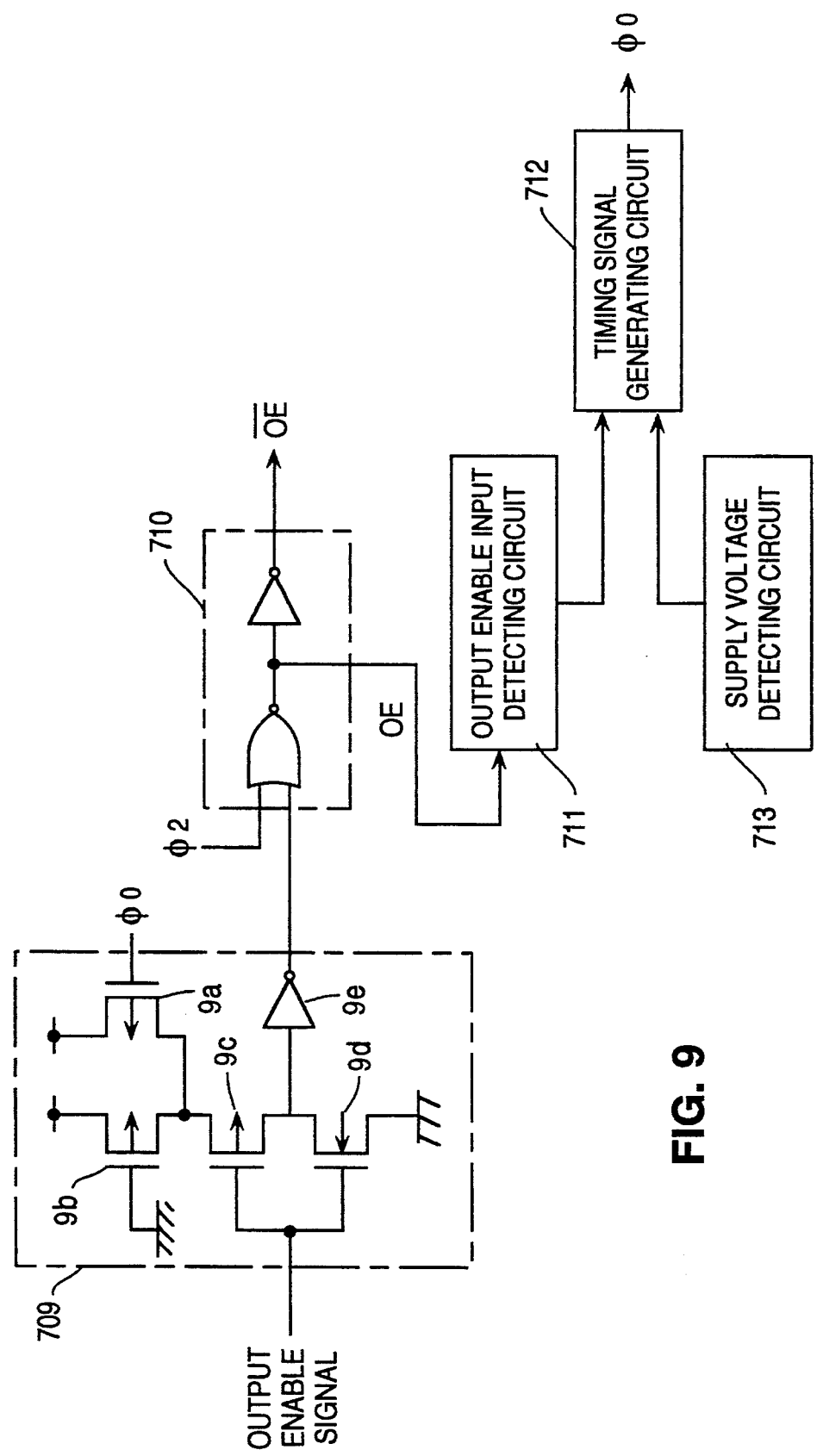
FIG. 9 shows an example of a circuit structure for an output enable input buffer circuit used in the semiconductor memory of FIG. 7.

FIGS. 8 and 9 show examples for circuit structures for the address input buffer circuit 701 and the output enable input buffer circuit 709, respectively. The circuit structures are the same as those shown in FIG. 3 except that inverters 1e and 9e are connected to drains of PMOS transistors 1c and 9c and NMOS transistors 1d and 9d constituting the CMOS structures, respectively.

When the signal $\phi_0$ undergoes a low to high transition (becomes active), PMOS transistors 1a and 9a are put in an OFF state. As a result, voltages dropped by PMOS transistors 1b and 9b are supplied to the PMOS transistors 1c and 9c as supply voltages, respectively. Thus, the inverted voltage $V_{INV}$ of the address input buffer circuit 701 and the output enable input buffer circuit 709 can be temporarily lowered while the signal $\phi_0$ is at a high level (active), thereby extending the noise margin.

Figure 10:
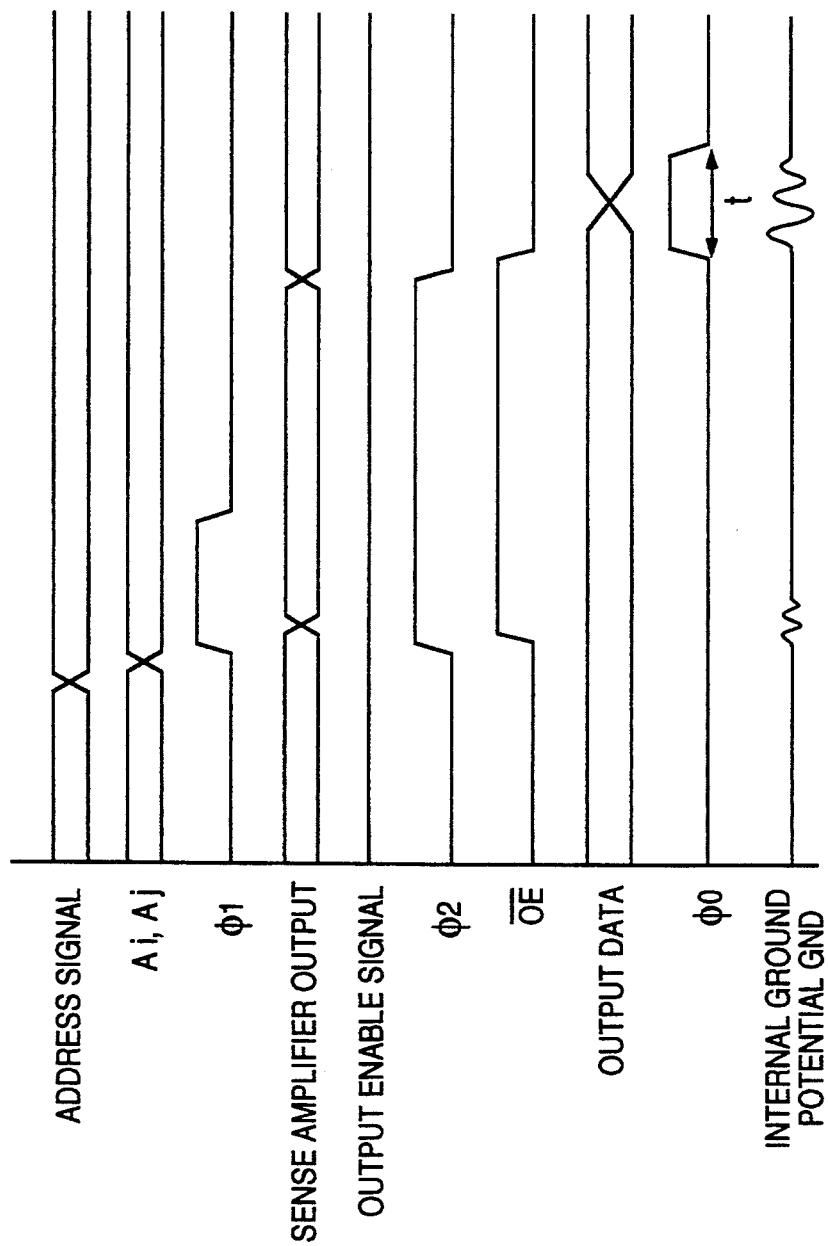
FIGS. 10 and 11 show a waveform for each signal used in the semiconductor memory of FIG. 7.

FIG. 10 shows a waveform for each signal used in the semiconductor memory 3. The operation of the semiconductor memory 3 will now be described referring to FIG. 10.

When the levels of the signals $A_i$ and $A_j$ output by the address input buffer circuit 701 are changed, the X decoder 702 and the Y decoder 703 start operating in response to the change. The X decoder 702 and the Y decoder 703 select at least one memory cell among a plurality of memory cells included in the memory cell array 704 in accordance with the signals $A_i$ and $A_j$. The timing signal generating circuit 708 changes the levels of the precharge signal $\phi_1$ and the output buffer stopping signal $\phi_2$ based on the changes of the signals $A_i$ and $A_j$, respectively. When the levels of the signals $A_i$ and $A_j$ change, the precharge signal $\phi_1$ undergoes a low to high transition (becomes active), resulting in precharging bit lines (not shown) of the memory cell array 704. When the level of the precharge signal $\phi_1$ is returned a low level (becomes non-active), the sense amplifier 705 reads data from the memory cell selected by the X decoder 702 and the Y decoder 703. Moreover, when the levels of the signals $A_i$ and $A_j$ change the output buffer stopping signal $\phi_2$ is kept at a high level (active) during a predetermined period of time. As a result, the output buffer operating signal $\overline{OE}$ is kept at a high level (non-active) while the output buffer stopping signal $\phi_2$ is at a high level (active). When the level of the output buffer stopping signal $\phi_2$ is returned to a low level (becomes non-active), the output buffer operating signal $\overline{OE}$ is also kept at a low level. As a result, the output buffer circuit 706 starts outputting the data read by the sense amplifier 705.

Figure 11:
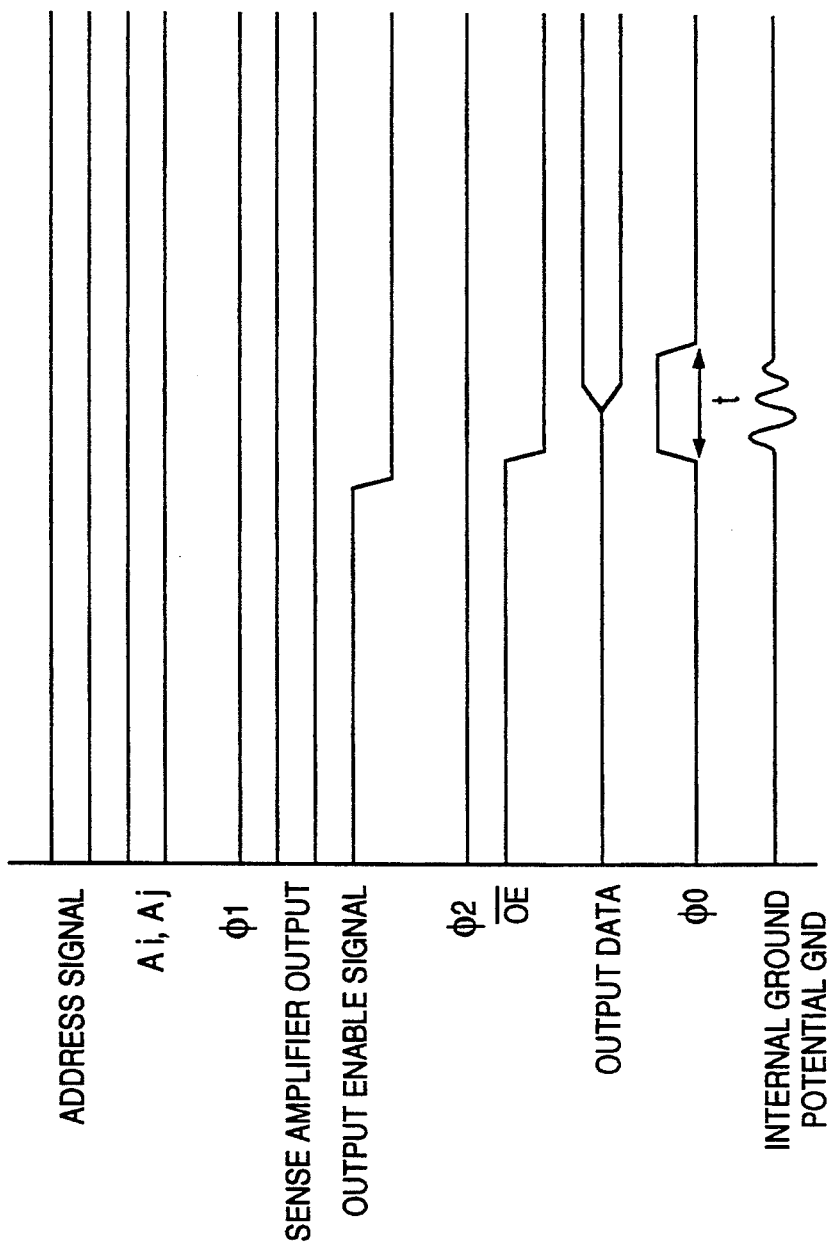

As is shown in FIG. 11, a high to low transition of the output enable signal (a transition to be active) causes a high to low transition of the output buffer operating signal $\overline{OE}$ (a transition to be active). As a result, the output buffer circuit 706 starts outputting the data read out by the sense amplifier 705.

In FIGS. 10 and 11, when the output buffer operating signal $\overline{OE}$ undergoes a high to low transition (becomes active), the output buffer circuit 706 starts operating. Then, the signal $\phi_0$ undergoes a low to high transition (becomes active) and is kept at a high level during a predetermined period t. The length of the period t is determined so that the amplitude of transient noise from the internal ground potential GND is reduced to be sufficiently small within the period t. The timing of the low to high transition of the signal $\phi_0$ is determined depending on various conditions such as the characteristics of other internal circuits. For example, under a particular condition, the length of the period t may be set to 15 to 20 ns, and the timing of the low to high transition of the signal $\phi_0$ may be earlier than the timing of the high to low transition of the output buffer operating signal $\overline{OE}$ by 0 to 5 ns. Thus, the response characteristics of the address input buffer circuit 701 and the output enable input buffer circuit 709 are lowered during the predetermined period of time as is mentioned above. As a result the signals $A_i$ and $A_j$ output by the address input buffer circuit 701 and the signal output by the output enable input buffer circuit 709 are not changed in error even when the internal ground potential GND is temporarily made unstable by the start of the operation of the output buffer circuit 706.

In this manner, according to this example, it is possible to keep stable the address input buffer circuit 701 and the output enable input buffer circuit 709 against the transient noise of the internal ground potential GND by temporarily lowering the response properties thereof in response to the signal $\phi_0$. In this manner a stable operation of a semiconductor memory can be attained even when the driving ability of the output buffer circuit 706 is improved or the response characteristics of the address input buffer circuit 701 and the output enable input buffer circuit 709 at the normal mode are improved.

When the supply voltage detecting circuit 713 detects that the supply voltage is lower than a predetermined voltage, the timing signal generating circuit 712 does not cause a low to high transition of the signal $\phi_0$ even when the output buffer operating signal $\overline{OE}$ undergoes a high to low transition. The reason is as follows: when the supply voltage is lower than a predetermined voltage, the noise margins of the address input buffer circuit 701 and the output enable input buffer circuit 709 become sufficiently large. Therefore, there is no need to degrade the response characteristics to avoid the malfunction.

Figure 12:
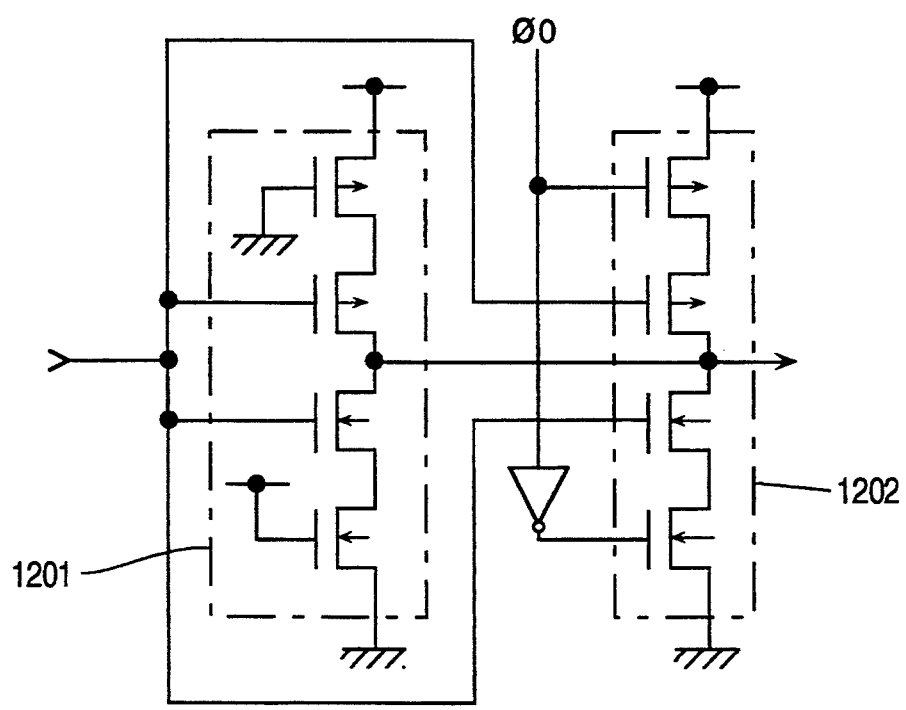
FIG. 12 shows another circuit structure for the input buffer circuit used in the semiconductor memory of FIG. 7.
Figure 13:
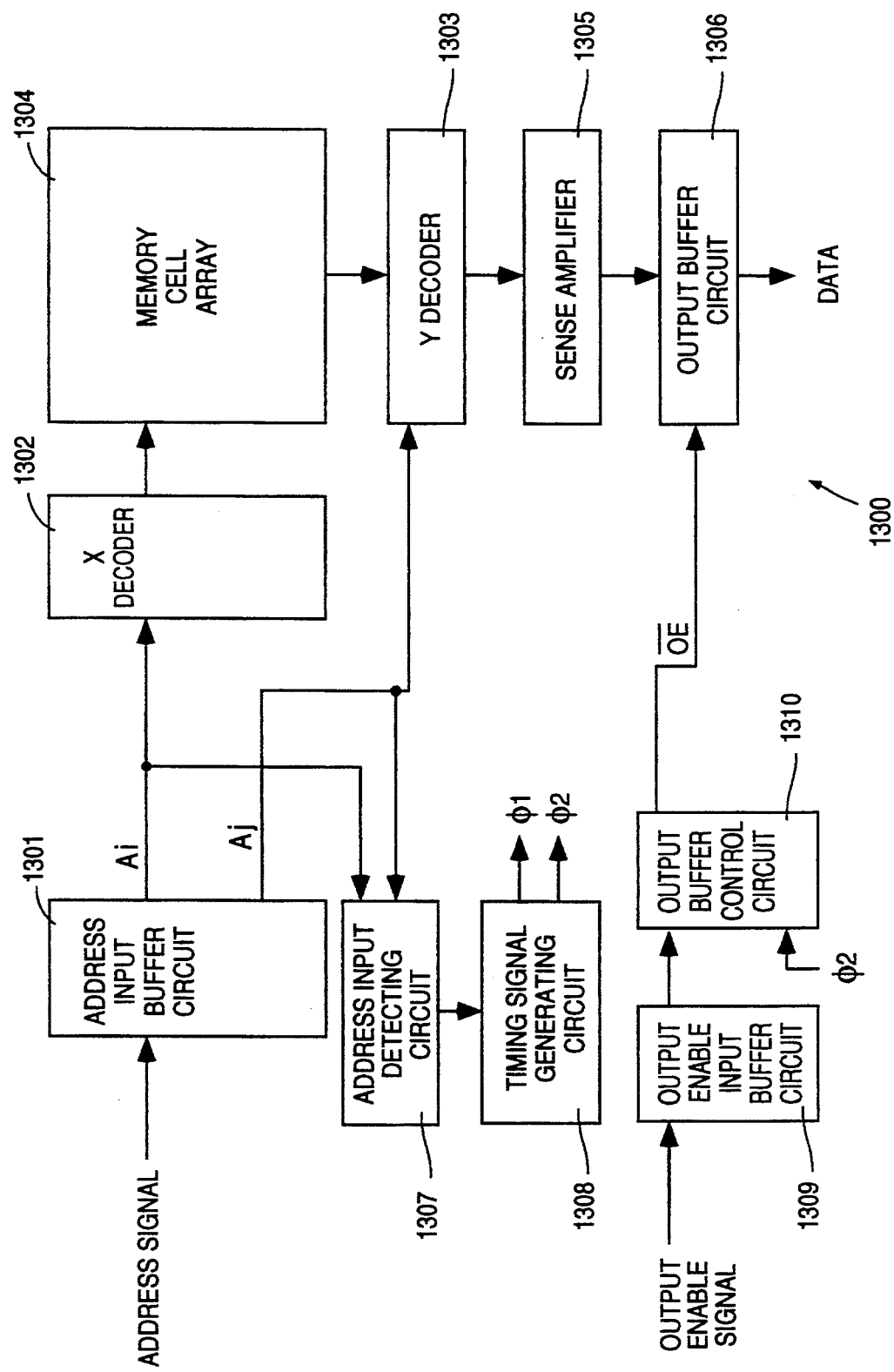
FIG. 13 shows a typical circuit structure for a conventional semiconductor memory.
Figure 14:
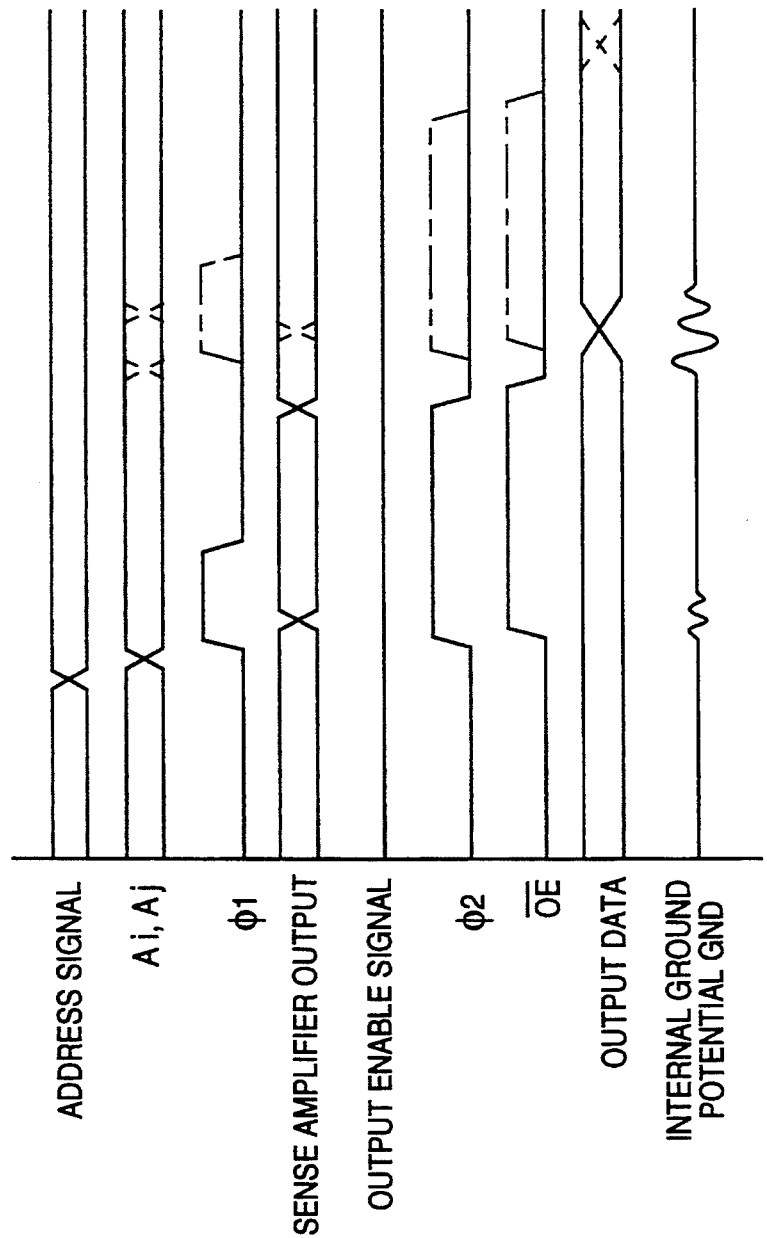
FIGS. 14 and 15 show a waveform for each signal used in the conventional semiconductor memory of FIG. 13.
Figure 15:
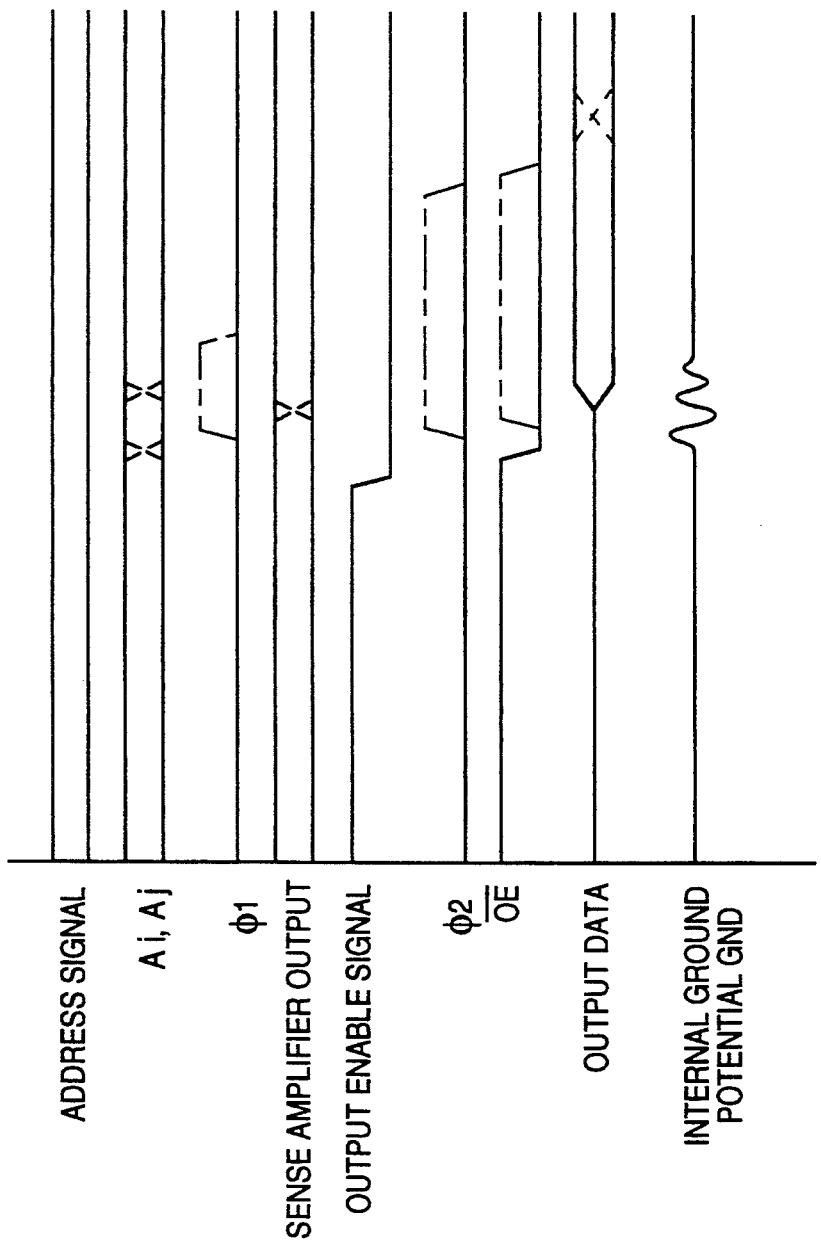

As shown in FIG. 12, the circuit structure of the address input buffer circuit 701 and the output enable input buffer circuit 709 shown in FIGS. 8 and 9 may include an inverter circuit 1201 and an inverter circuit 1202 controlled by the signal $\phi_0$. The inverter circuit 1202 is connected in parallel to the inverter circuit 1201. When the signal $\phi_0$ is at a high level, the response speed of the address input buffer circuit 701 and the output enable input buffer circuit 709 is temporarily degraded. This circuit structure is identical to that shown in FIG. 4.

As described above, according to the present invention, it is possible to prevent the malfunction of the input buffer circuit by degrading the response characteristics of the input buffer circuit during a predetermined period of time in starting the operation of the output buffer circuit. Thus, a stable operation of the semiconductor memory can be attained even when the driving ability of the output buffer circuit and the response characteristics of the input buffer circuit at a normal mode are improved. As a result, a semiconductor memory attains a rapid operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
   a memory cell array including a plurality of memory cells;
   an input buffer means for receiving an address signal having an amplitude at an interface level and generating at least one output signal having an amplitude at an internal logic level in accordance with said address signal, said input buffer means further receiving a first signal and changing a response characteristics of said input buffer means in response to said first signal;
   a detecting means for receiving said output signal and generating a detecting signal indicating whether the level of said output signal varies; and
   a control signal generating means for receiving said detecting signal and generating said first signal based on said detecting signal.

2. A semiconductor memory device according to claim 1 further comprising:
   a reading means for reading out data from at least one memory cell among said plurality of memory cells; and
   an output buffer means for outputting said read out data,
   wherein said control signal generating means further generates a control signal for deactivating said output buffer means during a predetermined period of time which is required to fix said read out data, and the level of said first signal varies depending upon said predetermined period of time.

3. A semiconductor memory device comprising:
   a memory cell array including a plurality of memory cells;
   an input buffer means for receiving an address signal having an amplitude at an interface level and generating at least one output signal having an amplitude at an internal logic level in accordance with said address signal, said input buffer means further receiving a first signal and changing a response characteristics of said input buffer means in response to said first signal; and
   a power supply voltage detecting means for generating a detecting signal having a first level and a second level and indicating whether a power supply voltage is higher than a predetermined voltage, said detecting signal being supplied to said input buffer means as said first Signal.

4. A semiconductor memory device comprising:
   a memory cell array including a plurality of memory cells;
   a first input buffer means for receiving a first signal having an amplitude at an interface level and generating a second signal having amplitude at an internal logic level in accordance with said first signal, said input buffer means further receiving a third signal and changing a response characteristics of said input buffer means in response to said third signal;
   a reading means for reading out data from at least one memory cell among said plurality of memory cells;
   an output buffer means for outputting said read out data;
   an output buffer control means for receiving said second signal and a fourth signal for deactivating said output buffer means during a predetermined period which is required to fix said read out data and generating a fifth signal for determining the timing for starting the operation of said output buffer means based on said second and said fourth signals;
   a detecting means for receiving said fifth signal and generating a sixth signal indicating whether the level of said fifth signal varies; and
   a control signal generating means for receiving said sixth signal and generating said third signal based on said sixth signal.

5. A semiconductor memory device according to claim 4 further comprising a second input buffer means for receiving an address signal having an amplitude at an interface level and generating at least one seventh signal having amplitude at an internal logic level in accordance with said address signal, said second input buffer means further receiving said third signal and changing a response characteristics of said second input buffer means in response to said third signal.

6. A semiconductor memory device according to claim 4 further comprising a supply voltage detecting means for generating an seventh signal indicating whether a supply voltage is higher than a predetermined voltage, wherein the control signal generating means further receives said seventh signal and generates said third signal based on said sixth and said seventh signal.

7. A semiconductor memory device according to claim 4, wherein the level of said third signal varies depending upon said predetermined period with respect to said fourth signal.

* * * * *